(12) United States Patent  (10) Patent No.: US 6,982,523 B2
Odaki  (45) Date of Patent: Jan. 3, 2006

(54) RED LIGHT EMITTING PHOSPHOR, ITS PRODUCTION AND LIGHT EMITTING DEVICE

(75) Inventor: Tsutomu Odaki, Nishishirakawa-gun (JP)

(73) Assignee: Kabushiki Kaisha Fine Rubber Kenkyuusho, Nishishirakawa-gun (JP)

( * ) Notice: Subject to any disclaimer, the term of this patent is extended or adjusted under 35 U.S.C. 154(b) by 250 days.

(21) Appl. No.: 10/352,131

(22) Filed: Jan. 28, 2003

(65) Prior Publication Data

US 2004/0145307 A1 Jul. 29, 2004

(51) Int. Cl.
H01J 1/62 (2006.01)
H01J 63/04 (2006.01)
C09K 11/68 (2006.01)
H01L 29/201 (2006.01)
H01L 29/227 (2006.01)

(52) U.S. Cl. .................. 313/503; 313/498; 313/499; 313/501; 313/502; 313/512; 257/89; 257/90; 257/98; 257/100; 252/301.4 R; 252/301.4 P; 252/301.5

(58) Field of Classification Search .......... 252/301.4 R, 252/301.5, 301.4 P; 257/89, 90, 98, 100; 313/499–502

See application file for complete search history.

(56) References Cited

U.S. PATENT DOCUMENTS 3,652,956 A    3/1972  Pinnow et al.
6,066,861 A    5/2000  Hohn et al.
6,717,348 B2 * 4/2004  Takahashi .................. 313/483
2001/0050371 A1  12/2001  Okaki et al.

FOREIGN PATENT DOCUMENTS

JP  11-246857   9/1999
JP  2000-144130  5/2000
JP  2001-267632  9/2001

OTHER PUBLICATIONS

F. Shi et al., *J. Phys. Chem Solids.*, vol. 59, No. 1, pp. 105–110 (1998).

J.P.M. Van Vliet, *J. Solid State Chem*, 76, pp. 160–166 (1998).

* cited by examiner

Primary Examiner—Nimeshkumar D. Patel
Assistant Examiner—Matt Hodges
(74) Attorney, Agent, or Firm—Oblon, Spivak, McClelland, Maier & Neustadt, P.C.

(57) ABSTRACT

As a red light emitting phosphor capable of efficiently emitting red light at a high luminance in response to exciting light having a wavelength of 350–420 nm, and practically used in a light emitting device for red display or a light emitting device for white or intermediate color display in combination with green and blue light emitting phosphors, the invention provides a red light emitting phosphor capable of emitting red light upon excitation with light having a wavelength of 350–420 nm and having compositional formula (1):

$$AEu_xLn_{(1-x)}M_2O_8 \quad (1)$$

wherein A is at least one element selected from among Li, Na, K, Rb and Cs, Ln is at least one element selected from among Y and rare earth elements exclusive of Eu, M is at least one element selected from among W and Mo, and x is a positive number satisfying $0 < x \leq 1$; and a red light emitting phosphor having compositional formula (2):

$$D_{0.5}Eu_yLn_{(1-y)}M_2O_8 \quad (2)$$

wherein D is at least one element selected from among Mg, Ca, Sr and Ba, Ln is at least one element selected from among Y and rare earth elements exclusive of Eu, M is at least one element selected from among W and Mo, and y is a positive number satisfying $0 < y \leq 1$. Methods for preparing the red light emitting phosphors, and light emitting devices using the red light emitting phosphors are also provided.

14 Claims, 6 Drawing Sheets

TRIVALENT Eu ION ($Eu^{3+}$)

TRIVALENT Eu ION ($Eu^{3+}$)

RED LIGHT EMITTING PHOSPHOR, ITS PRODUCTION AND LIGHT EMITTING DEVICE

BACKGROUND OF THE INVENTION

This invention relates to red light emitting phosphors capable of emitting red light upon excitation with long-wavelength ultraviolet radiation or short-wavelength visible light of 350 to 420 nm, methods for preparing the same, and light emitting devices comprising the read light emitting phosphors.

Light emitting diodes (LEDs) are semiconductor light emitters adapted to produce light by converting electrical energy into ultraviolet light, visible light, infrared light or the like. For example, those emitters utilizing visible light are semiconductor light emitters formed from light emitting materials such as GaP, GaAsP and GaAlAs, and LED lamps having such emitters encapsulated with transparent resins are widely used. Also LED lamps of the display type are often used in which light emitting materials are secured to an upper surface of a printed circuit board or metal leads and encased in a transparent resin casing on which numerical figures or characters are configured.

LEDs have a long lifetime and high reliability because of semiconductor devices, and facilitate replacement operation when used as light sources. LEDs are thus widely used as components in portable communications equipment, personal computer peripheral equipment, business machines, household electric appliances, audio equipment, switches, back light sources, and display device such as bulletin boards.

The color of light emitted by the LED lamps can be altered by introducing various powder phosphors into transparent resins with which semiconductor light emitters are encapsulated. Depending on the intended application, any color in a wide spectrum in the visible region from blue to red is available.

However, recently users increasingly impose a more stringent demand on the color of such various display device, requiring display devices to have an ability to precisely reproduce a subtle color tone. It is strongly required that a single LED lamp emit white or any desired intermediate color light.

Attempts were then made to display white or any desired intermediate color with a single LED lamp by applying various red, green and blue phosphors to the surface of the semiconductor light emitter in the LED lamp, or incorporating such various phosphors in the encapsulant or coating material of the LED lamp.

Among these phosphors, currently used typical examples of those phosphors to be excited with long-wavelength ultraviolet radiation or short-wavelength visible light (350 to 420 nm) include $BaMg_2Al_{16}O_{27}$:Eu and $(Sr,Ca,Ba)_5(PO_4)_3Cl$:Eu for emission of blue light, $BaMg_2Al_{16}O_{27}$:Eu,Mn and $Zn_2GeO_4$:Mn for emission of green light, and $Y_2O_2S$:Eu, $La_2O_2S$:Eu and $3.5MgO \cdot 0.5MgF_2 \cdot GeO_2$:Mn for emission of red light. Using appropriate ones of these light emitting phosphors, an emission color over a wide range is available.

However, the above-noted red light emitting phosphors have the problem of weak light emission to long-wavelength ultraviolet radiation and short-wavelength visible light (350 to 420 nm), as compared with the blue and green light emitting phosphors.

Then, when whitish light is produced using lights of these wavelengths, the proportion of the red light emitting phosphor must be increased at the sacrifice of cost. Since white color of light is obtainable by balancing the quantities of red, green and blue light emissions, the quantities of green and blue light emissions must be reduced in proportion to the quantity of red light emission in order to produce emission of a whitish light. Further, an upper limit is imposed on the amount of phosphors used. As a result, a less quantity of white light emission is available, giving rise to problems including a failure to produce white light with a high luminance.

The wavelength corresponding to the excitation energy of electron pairs oxide base compounds possess is within the ultraviolet region, and the wavelength of long-wavelength ultraviolet radiation and short-wavelength visible light (350 to 420 nm) overlies the absorption edge of phosphors. Then, particularly for red light emitting phosphors, there arises the problem that the quantity of light emission of a phosphor changes significantly if the peak of emission wavelength of a semiconductor light emitter varies.

To solve this problem, rare earth oxysulfide phosphors activated with europium are proposed in JP-A 11-246857, JP-A 2000-144130, etc. It is reported that the excitation wavelength for these phosphors is shifted to the longer wavelength side.

On a longer than 350 nm wavelength side, however, the absorption intensity of these red light emitting phosphors shows a sharp decline as the wavelength becomes longer. When a light source with an emission peak at 350 to 420 nm, for example, a ultraviolet LED is used as an excitation light source, the quantity of emission of a phosphor changes significantly due to variations of the wavelength of LED emission, that is, the wavelength of excitation light, which inevitably occur for manufacturing reasons. This results in variations of color tone when the above phosphor is used in combination with green and blue light emitting phosphors to produce white or intermediate color. The conventional red light emitting phosphors are difficult to precisely reproduce a subtle color tone.

SUMMARY OF THE INVENTION

An object of the present invention is to provide a red light emitting phosphor which emits red light at a high efficiency and a high luminance in response to excitation light of 350 to 420 nm wavelength, and which can be practically used as a light emitting device for red color display or in combination with green and blue light emitting phosphors to construct a light emitting device for white or intermediate color display; a method for preparing the same; and a light emitting device comprising the same.

Making extensive investigations to solve the above problems, the inventor has found that a red light emitting phosphor represented by the compositional formula (1) or (2) below and capable of emitting red light upon excitation with light having a wavelength of 350 to 420 nm emits red light at a high efficiency and a high luminance in response to excitation light of 350 to 420 nm wavelength, that is, emits red light at a consistent intensity in response to radiation of a wavelength in the wide range from long-wavelength ultraviolet radiation to short-wavelength visible light.

It has also been found that this red light emitting phosphor can be practically used as a light emitting device for red color display or in combination with green and blue light emitting phosphors to construct a light emitting device for white or intermediate color display; and that when this red light emitting phosphor is combined with green and blue light emitting phosphors so that the phosphors generate light for white or intermediate color display in response to the light of the aforementioned wavelength emitted by a semiconductor light emitter, a subtle color tone is precisely displayed in a reproducible manner because this red light-emitting phosphor is little affected by variations in wavelength of the exciting light.

It has further been found that when a red light emitting phosphor of compositional formula (1) below is prepared by mixing raw materials containing elements constituting the red light emitting phosphor, firing the resulting mixture, and washing the fired product with an aqueous alkali solution, or when a red light emitting phosphor of compositional formula (2) below is prepared by mixing raw materials containing elements constituting the red light emitting phosphor, firing the resulting mixture, and washing the fired product with an aqueous acid solution, the red light emitting phosphor having a higher emission intensity is obtainable.

Namely, the present invention provides a red light emitting phosphor, a method for preparing the same, and a light emitting device comprising the same, which are defined below.

[1] A red light emitting phosphor capable of emitting red light upon excitation with light having a wavelength of 350 to 420 nm, characterized by having a composition of compositional formula (1):

$$AEu_xLn_{(1-x)}M_2O_8 \quad (1)$$

wherein A is at least one element selected from the group consisting of Li, Na, K, Rb and Cs, Ln is at least one element selected from the group consisting of Y and rare earth elements exclusive of Eu, M is at least one element selected from the group consisting of W and Mo, and x is a positive number satisfying $0<x\leq 1$.

[2] The red light emitting phosphor of [1], characterized in that A in the compositional formula (1) is partially substituted with at least one element selected from the group consisting of Mg, Ca, Sr and Ba to be added as a co-activator.

[3] A red light emitting phosphor capable of emitting red light upon excitation with light having a wavelength of 350 to 420 nm, characterized by having a composition of compositional formula (2):

$$D_{0.5}Eu_yLn_{(1-y)}M_2O_8 \quad (2)$$

wherein D is at least one element selected from the group consisting of Mg, Ca, Sr and Ba, Ln is at least one element selected from the group consisting of Y and rare earth elements exclusive of Eu, M is at least one element selected from the group consisting of W and Mo, and y is a positive number satisfying $0<y\leq 1$.

[4] The red light emitting phosphor of [1] or [3], characterized in that Ln in the formula is at least one element selected from the group consisting of Y, La, Gd and Lu.

[5] The red light emitting phosphor of [1] or [3], characterized in that Eu constituting the red light emitting phosphor is in the form of trivalent europium ions ($Eu^{3+}$) which are arranged in a two- or one-dimensional array.

[6] A method for preparing the red light emitting phosphor of [1], characterized by comprising the steps of mixing raw materials containing elements constituting the red light emitting phosphor, firing the resulting mixture, and washing the fired product with an aqueous alkali solution.

[7] A method for preparing the red light emitting phosphor of [3], characterized by comprising the steps of mixing raw materials containing elements constituting the red light emitting phosphor, firing the resulting mixture, and washing the fired product with an aqueous acid solution.

[8] A light emitting device comprising a semiconductor light emitter capable of emitting light having a wavelength of 350 to 420 nm, enclosed in an encapsulant, characterized in that the red light emitting phosphor of [1] or [3] is dispersed in the encapsulant.

[9] A light emitting device comprising a semiconductor light emitter capable of emitting light having a wavelength of 350 to 420 nm, enclosed in an encapsulant, characterized in that a fluorescent layer containing the red light emitting phosphor of [1] or [3] is disposed in an optical path of the light from the semiconductor light emitter.

[10] A light emitting device comprising a semiconductor light emitter capable of emitting light having a wavelength of 350 to 420 nm, enclosed in an encapsulant, characterized in that a fluorescent layer containing the red light emitting phosphor of [1] or [3] is disposed on the semiconductor light emitter or the encapsulant.

[11] A light emitting device comprising a semiconductor light emitter capable of emitting light having a wavelength of 350 to 420 nm, enclosed in an encapsulant, characterized in that a fluorescent layer comprising the red light emitting phosphor of [1] or [3] dispersed in a resin, rubber, elastomer or glass is disposed on the semiconductor light emitter or the encapsulant.

DETAILED DESCRIPTION OF THE INVENTION

Figure 1:
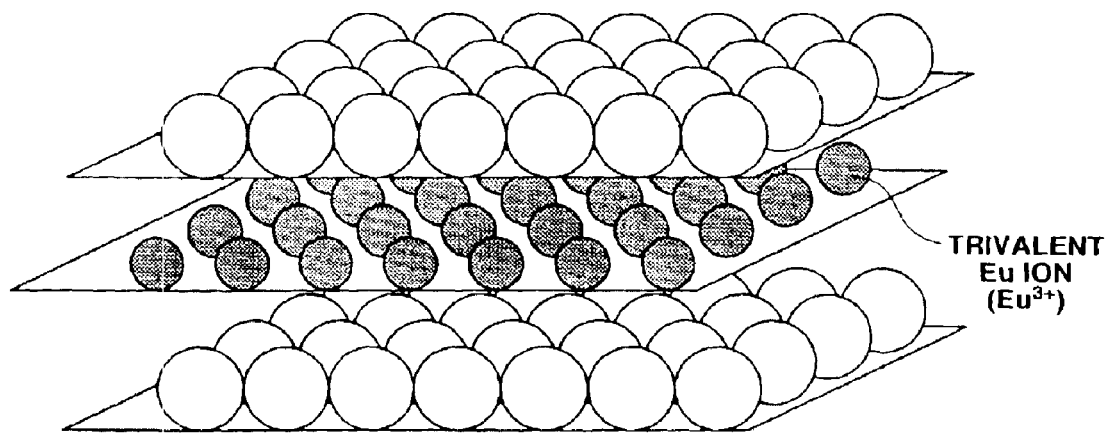
FIG. 1 is a schematic view illustrating the state where trivalent europium ions ($Eu^{3+}$) are arranged in a two-dimensional array.

[First Embodiment of Red Light Emitting Phosphor]

The first embodiment of the red light emitting phosphor according to the invention is described. The first embodiment is a red light emitting phosphor capable of emitting red light upon excitation with light having a wavelength of 350 to 420 nm and having a composition of compositional formula (1):

$$AEu_xLn_{(1-x)}M_2O_8 \qquad (1)$$

wherein A is at least one element selected from the group consisting of Li, Na, K, Rb and Cs; Ln is at least one element selected from the group consisting of Y and rare earth elements exclusive of Eu; M is at least one element selected from the group consisting of W and Mo; and x is a positive number satisfying $0<x\leq1$, preferably $0.3\leq x\leq1$, most preferably $0.5\leq x\leq1$.

In compositional formula (1), Ln is at least one element selected from the group consisting of Y and rare earth elements exclusive of Eu, while Y, La, Gd and Lu are preferred. A is preferably at least one element selected from Li and Na having an ionic radius close to that of Eu. Of these compositions, LiEuM$_2$O$_8$ and LiEu$_x$Y$_{(1-x)}$M$_2$O$_8$ are especially preferred.

Also preferred in the invention are those red light emitting phosphors of the compositional formula (1) wherein A (which is at least one element selected from the group consisting of Li, Na, K, Rb and Cs) is partially substituted with at least one element selected from the group consisting of Mg, Ca, Sr and Ba to be added as a co-activator. In this embodiment, the degree of substitution is preferably less than 0.5 (atomic ratio), more preferably up to 0.3 (atomic ratio), even more preferably up to 0.2 (atomic ratio), most preferably up to 0.1 (atomic ratio), as expressed by the ratio of the total amount of Mg, Ca, Sr and Ba to the total amount of Li, Na, K, Rb and Cs.

The red light emitting phosphor of compositional formula (1) can be prepared by mixing raw materials containing elements constituting the red light emitting phosphor, firing the resulting mixture, optionally grinding and sieving the fired product. The fired product is preferably washed with an aqueous alkali solution because the resulting red light emitting phosphor is capable of emitting red light of a higher luminance. Examples of the aqueous alkali solution used herein include an aqueous lithium hydroxide solution, an aqueous sodium hydroxide solution, and an aqueous potassium hydroxide solution, with the pH being preferably 8 or higher. Washing with an aqueous alkali solution can be carried out by immersing the fired product in an aqueous alkali solution, optionally followed by agitation. Once washed with the aqueous alkali solution, the fired product is separated from the aqueous alkali solution, washed with water and dried, yielding a red light emitting phosphor.

[Second Embodiment of Red Light Emitting Phosphor]

The second embodiment of the red light emitting phosphor according to the invention is described. The second embodiment is a red light emitting phosphor capable of emitting red light upon excitation with light having a wavelength of 350 to 420 nm and having a composition of compositional formula (2):

$$D_{0.5}Eu_yLn_{(1-y)}M_2O_8 \qquad (2)$$

wherein D is at least one element selected from the group consisting of Mg, Ca, Sr and Ba; Ln is at least one element selected from the group consisting of Y and rare earth elements exclusive of Eu; M is at least one element selected from the group consisting of W and Mo; and y is a positive number satisfying $0<y\leq1$, preferably $0.3\leq y\leq1$, most preferably $0.5\leq y\leq1$.

In compositional formula (2), Ln is at least one element selected from the group consisting of Y and rare earth elements exclusive of Eu, while Y, La, Gd and Lu are preferred. D is preferably at least one element selected from Ca and Sr having an ionic radius close to that of Eu.

The red light emitting phosphor of compositional formula (2) can be prepared by mixing raw materials containing elements constituting the red light emitting phosphor, firing the resulting mixture, optionally grinding and sieving the fired product. The fired product is preferably washed with an aqueous acid solution because the resulting red light emitting phosphor is capable of emitting red light of a higher luminance. Examples of the aqueous acid solution used herein include an aqueous hydrochloric acid solution, an aqueous sulfuric acid solution, and an aqueous nitric acid solution, with the pH being preferably 6 or lower. Washing with an aqueous acid solution can be carried out by immersing the fired product in an aqueous acid solution, optionally followed by agitation. Once washed with the aqueous acid solution, the fired product is separated from the aqueous acid solution, washed with water and dried, yielding a red light emitting phosphor.

[Red Light Emitting Phosphor]

Figure 2:
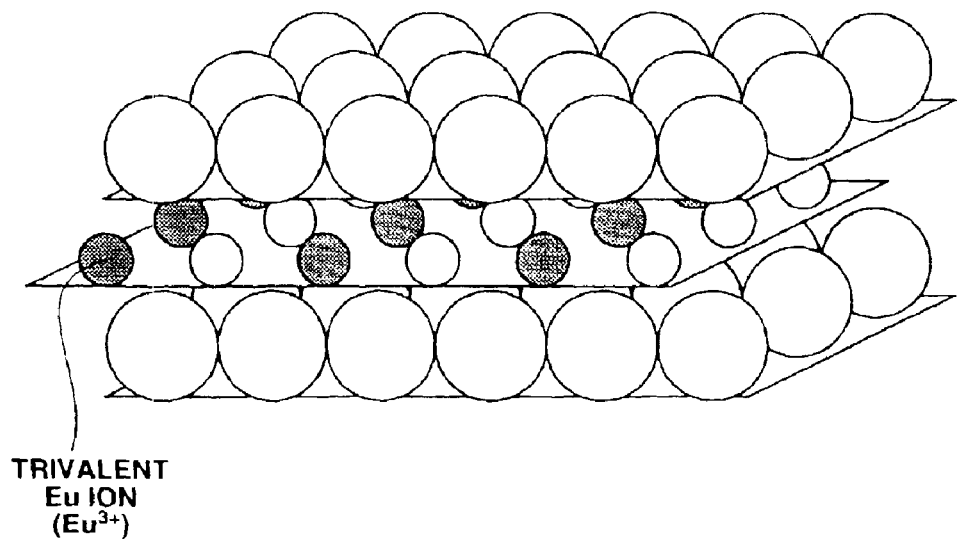
FIG. 2 is a schematic view illustrating the state where trivalent europium ions ($Eu^{3+}$) are arranged in a one-dimensional array.

In the red light emitting phosphor of the invention, Eu constituting the red light emitting phosphor is preferably in the form of trivalent europium ions (Eu$^{3+}$) and especially, trivalent europium ions are arranged in a two- or one-dimensional array. The arrangement of trivalent europium ions in a two-dimensional array refers to the state in which trivalent europium ions in the red light emitting phosphor are arranged in a plane, as shown in FIG. 1, forming a planar structure consisting of trivalent europium ions. The arrangement of trivalent europium ions in a one-dimensional array refers to the state in which trivalent europium ions in the red light emitting phosphor are arranged in straight lines, as shown in FIG. 2, forming a linear structure consisting of trivalent europium ions.

In oxide base phosphors, host crystals absorb excitation light and conduct the excitation energy to emissive ions to produce light. Ordinary oxide base phosphors provide insufficient absorption of long-wavelength ultraviolet radiation to short-wavelength visible light (350 to 420 nm) because the wavelength corresponding to the excitation energy of their electron pairs is in the ultraviolet region.

In ordinary phosphors, the concentration of emissive ions (activator) is several molar percents relative to the host crystals. As is well known, concentration quenching occurs at concentrations above that level for the reasons that (1) cross relaxation occurs between activators due to resonant transfer whereby part of the excitation energy is lost, (2) migration of excitation occurs due to resonant transfer between activators, which promotes the transfer of excitation to the crystal surface or non-luminescence center and annihilation, and (3) activators convert to non-luminescence centers or killers (luminescence inhibitors) by agglomerating together or forming ion pairs.

On the other hand, in the phosphor in which trivalent europium ions are arranged in a two- or one-dimensional array, trivalent europium ions ($Eu^{3+}$) absorb the excitation radiation and act as the luminescence center, and the trivalent europium ions which are emissive ions directly absorb the long-wavelength ultraviolet radiation to short-wavelength visible light (350 to 420 nm). Furthermore, since there is a large spacing between layers where emissive ions are arranged, the migration of the excitation energy is controlled, prohibiting concentration quenching. For this reason, odd electrons within the 4f orbit of trivalent europium ions efficiently absorb the long-wavelength ultraviolet radiation to short-wavelength visible light (350 to 420 nm), producing red light emission at a high luminance.

[First Embodiment of Light Emitting Device]

The first embodiment of the light emitting device according to the invention is described. The first embodiment is a light emitting device comprising a semiconductor light emitter capable of emitting light having a wavelength of 350 to 420 nm, enclosed in an encapsulant, wherein the inventive red light emitting phosphor described above is dispersed in the encapsulant.

Figure 3:
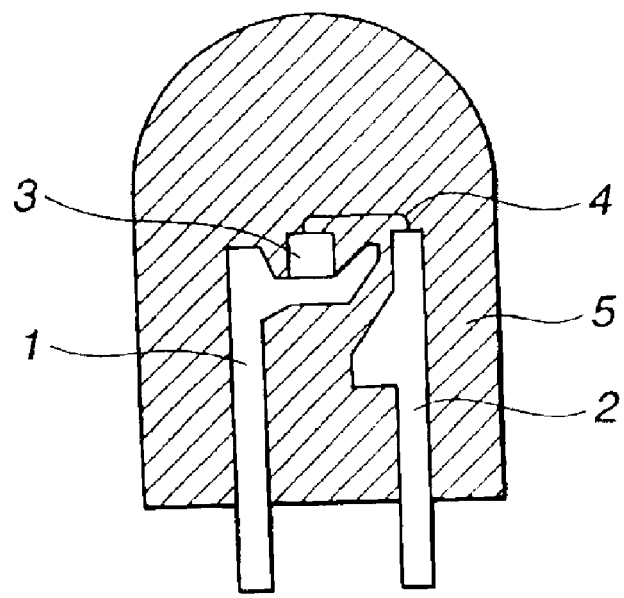
FIG. 3 is a cross-sectional view of a light emitting device according to one embodiment of the invention, in which the red light emitting phosphor of the invention is dispersed in an encapsulant of a bullet-shaped light emitting diode.
Figure 4:
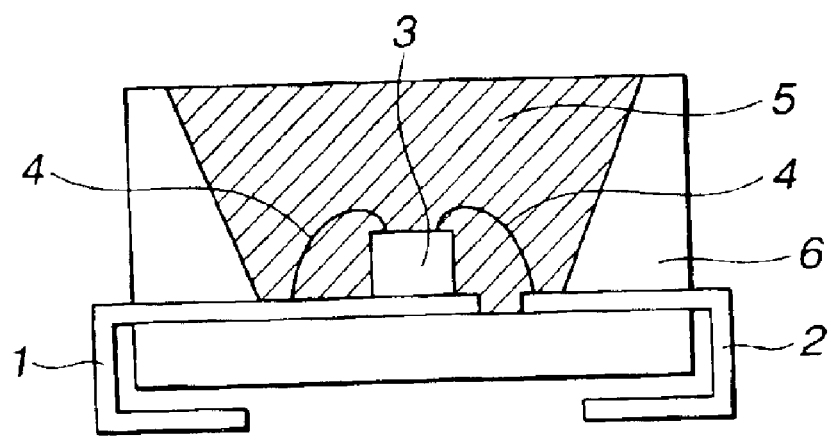
FIG. 4 is a cross-sectional view of a light emitting device according to one embodiment of the invention, in which the red light emitting phosphor of the invention is dispersed in an encapsulant of a chip-shaped light emitting diode.

Illustrative embodiments include a so-called bullet-shaped light emitting diode of the structure wherein leads 1 and 2, a semiconductor light emitter 3 capable of emitting light having a wavelength of 350 to 420 nm, and a lead thin wire 4 electrically connecting the semiconductor light emitter 3 to the lead 2 are enclosed in an encapsulant 5 of a bullet shape, as shown in FIG. 3; and a so-called chip type light emitting diode of the structure wherein a pair of leads 1 and 2 extend from the inner bottom of an emitter casing 6 of box shape having an open top to the outside of the casing 6, a semiconductor light emitter 3 capable of emitting light having a wavelength of 350 to 420 nm and lead thin wires 4, 4 are accommodated within the casing 6, these components are connected, and the interior of the casing 6 is filled with an encapsulant 5, as shown in FIG. 4. The red light emitting phosphor of the invention is dispersed in the encapsulant 5.

In these embodiments, when the red light-emitting phosphor of the invention is dispersed alone in the encapsulant 5, the resulting light emitting device emits red light at a high luminance. When the red light-emitting phosphor of the invention is dispersed in the encapsulant 5 along with a green light-emitting phosphor such as $BaMg_2Al_{16}O_{27}$:Eu, Mn, $Zn_2GeO_4$:Mn or the like, and a blue light-emitting phosphor such as $BaMg_2Al_{16}O_{27}$:Eu, $(Sr,Ca,Ba)_5(PO_4)_3$Cl:Eu or the like, the resulting light emitting device emits white or intermediate color light at a high luminance. In any of these light emitting devices, it is possible to add a red light-emitting phosphor other than the inventive red light-emitting phosphor, such as $Y_2O_2S$:Eu, $La_2O_2S$:Eu, $3.5MgO \cdot 0.5MgF_2 \cdot GeO_2$:Mn or the like as the red light-emitting phosphor.

The light emitting device illustrated above can be fabricated by encapsulating a semiconductor light emitter or the like with an encapsulant material based on a resin, rubber, elastomer, glass or the like while admixing the phosphor with the encapsulant material. Particularly when two or more phosphors are used, the red light-emitting phosphor of the invention, which has a higher true specific gravity than conventional phosphors, can settle down faster than the other phosphor(s) when admixed with the encapsulant material, with the risk of inducing color variations. For this reason, the red light-emitting phosphor of the invention is preferably dispersed in an encapsulant material by mixing it with a high viscosity material such as a silicone rubber composition or silicone resin composition whose viscosity has been adjusted using a thixotropy regulating agent, followed by curing. Besides the above-mentioned phosphors, pigments, dyes, pseudo-pigments or the like may also be added to the encapsulant material as a tone converting material.

[Second Embodiment of Light Emitting Device]

The second embodiment of the light emitting device according to the invention is described. The second embodiment is a light emitting device comprising a semiconductor light emitter capable of emitting light having a wavelength of 350 to 420 nm, enclosed in an encapsulant, wherein a fluorescent layer containing the red light emitting phosphor described above is disposed in an optical path of the light from the semiconductor light emitter.

Figure 5:
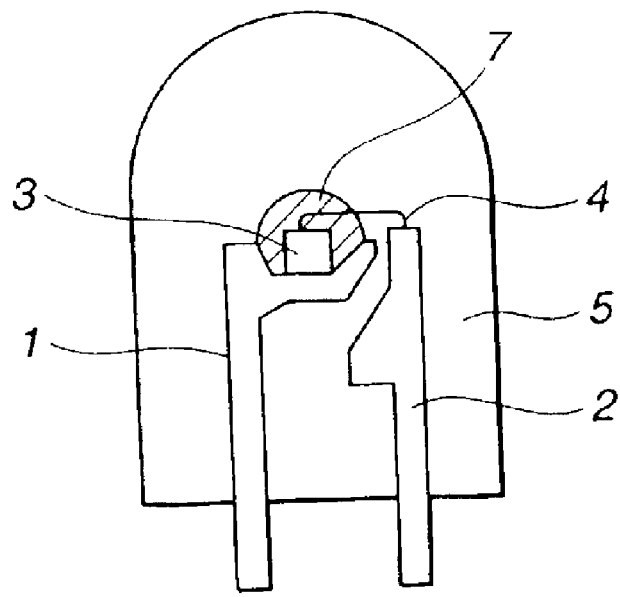
FIG. 5 is a cross-sectional view of a light emitting device according to one embodiment of the invention, in which a fluorescent layer containing the red light emitting phosphor of the invention is disposed on a semiconductor light emitter in a bullet-shaped light emitting diode.
Figure 6:
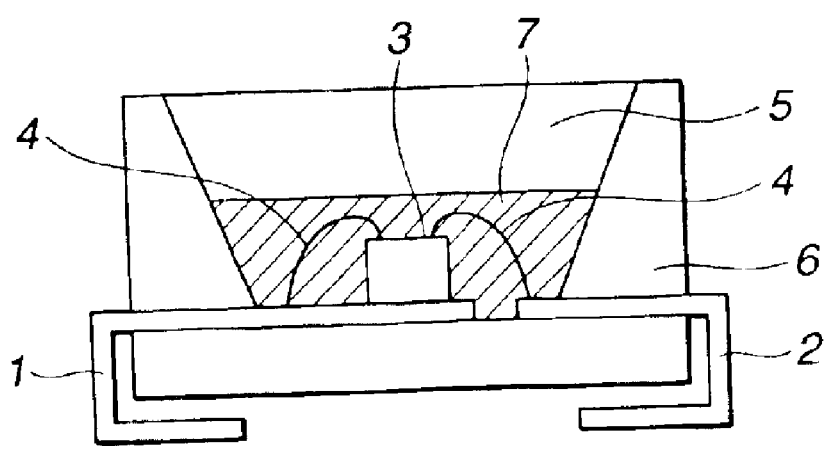
FIG. 6 is a cross-sectional view of a light emitting device according to one embodiment of the invention, in which a fluorescent layer containing the red light emitting phosphor of the invention is disposed on a semiconductor light emitter in a chip-shaped light emitting diode.
Figure 7:
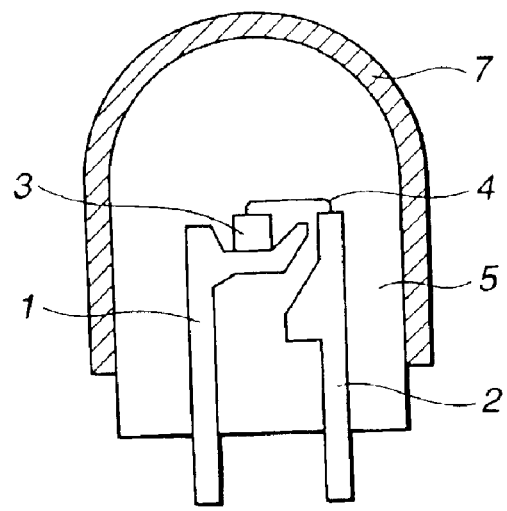
FIG. 7 is a cross-sectional view of a light emitting device according to one embodiment of the invention, in which a fluorescent layer containing the red light emitting phosphor of the invention is disposed on an encapsulant in a bullet-shaped light emitting diode.
Figure 8:
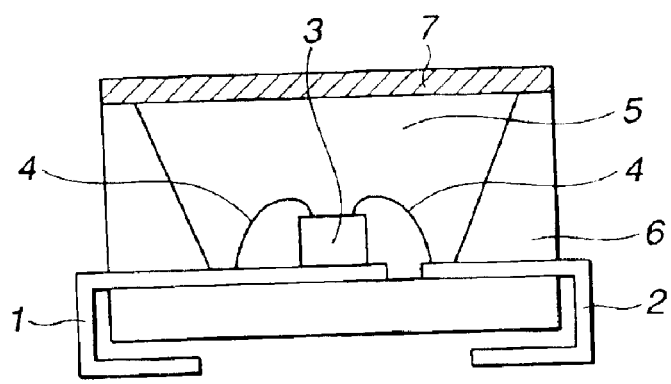
FIG. 8 is a cross-sectional view of a light emitting device according to one embodiment of the invention, in which a fluorescent layer containing the red light emitting phosphor of the invention is disposed on an encapsulant in a chip-shaped light emitting diode.

Exemplary of such devices are embodiments wherein a fluorescent layer containing the red light emitting phosphor of the invention is disposed on the semiconductor light emitter or the encapsulant. Illustrative embodiments include a so-called bullet-shaped light emitting diode of the structure wherein leads 1 and 2, a semiconductor light emitter 3 capable of emitting light having a wavelength of 350 to 420 nm, and a lead thin wire 4 electrically connecting the semiconductor light emitter 3 to the lead 2 are enclosed in an encapsulant 5 of a bullet shape, as shown in FIG. 5, and wherein a fluorescent layer 7 is disposed on the semiconductor light emitter 3 and encapsulated together with the semiconductor light emitter 3 and other components; a so-called chip type light emitting diode of the structure wherein a pair of leads 1 and 2 extend from the inner bottom of an emitter casing 6 of box shape having an open top to the outside of the casing 6, a semiconductor light emitter 3 capable of emitting light having a wavelength of 350 to 420 nm and lead thin wires 4, 4 are accommodated within the casing 6, these components are connected, and the interior of the casing 6 is filled with an encapsulant 5, as shown in FIG. 6, and wherein a fluorescent layer 7 is disposed on the semiconductor light emitter 3 of the chip type light emitting diode and encapsulated with the encapsulant 5 together with the semiconductor light emitter 3 and other components; a bullet-shaped light emitting diode as shown in FIG. 7 wherein a fluorescent layer 7 is disposed on the encapsulant 5 so as to cover the encapsulant 5; and a chip type light emitting diode as shown in FIG. 8 wherein a fluorescent layer 7 lies on the encapsulant 5. It is noted that since the components other than the fluorescent layer in FIGS. 7 and 8 are the same as the corresponding components in FIGS. 3 and 4, their description is omitted.

Figure 9:
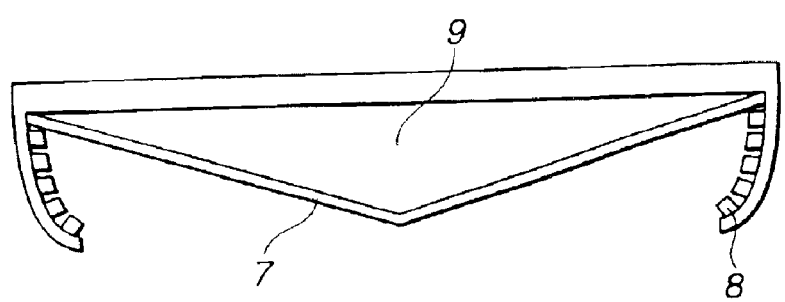
FIG. 9 is a cross-sectional view of a light emitting device according to one embodiment of the invention, in which a fluorescent layer is spaced apart from LED and which is constructed such that light emitted by the fluorescent layer is reflected.

The inventive device is not limited to the embodiments of the so-called transmission type wherein a fluorescent layer is disposed within or adjacent to a light emitting diode as described above, and can also be embodied as a light emitting device of the reflection type comprising a fluorescent layer 7 spaced apart from light emitting diodes 8 and a reflector 9 wherein the reflector 9 reflects the light emitted by the fluorescent layer as shown in FIG. 9. In the light emitting device having a fluorescent layer lying on the encapsulant as shown in FIGS. 7 and 8, the fluorescent layer may be further covered with an encapsulant.

In these embodiments, when the red light-emitting phosphor of the invention is dispersed alone in the fluorescent layer, the resulting light emitting device emits red light at a high luminance. When the red light-emitting phosphor of the invention is dispersed along with a green light-emitting phosphor such as $BaMg_2Al_{16}O_{27}$:Eu,Mn, $Zn_2GeO_4$:Mn or the like, and a blue light-emitting phosphor such as $BaMg_2Al_{16}O_{27}$:Eu, $(Sr,Ca,Ba)_5(PO_4)_3Cl$:Eu or the like, the resulting light emitting device emits white or intermediate color light at a high luminance. In any of these light emitting devices, it is possible to add a red light-emitting phosphor other than the inventive red light-emitting phosphor, such as $Y_2O_2S$:Eu, $La_2O_2S$:Eu, $3.5MgO\cdot0.5MgF_2\cdot GeO_2$:Mn or the like as the red light-emitting phosphor.

Where the fluorescent layer is disposed on the semiconductor light emitter, the phosphor may be used alone or in admixture with a binder. In this case, the fluorescent layer is enclosed in the encapsulant together with the semiconductor light emitter as shown in FIGS. 5 and 6.

On the other hand, where the fluorescent layer is disposed on the encapsulant, the red light emitting phosphor is preferably used as a dispersion in a light transmissive resin, rubber, elastomer or glass, especially a silicone resin or silicone rubber. Particularly when two or more phosphors are dispersed in the fluorescent layer, the inventive red light-emitting phosphor is preferably dispersed in the fluorescent layer by mixing it with a silicone rubber composition or silicone resin composition whose viscosity has been adjusted using a thixotropy regulating agent, followed by curing, as in the aforementioned embodiment where the inventive red light-emitting phosphor is dispersed in the encapsulant. The fluorescent layer may be a single layer formed of a mixture of phosphors or a laminate consisting of layers of individual phosphors. Besides the above-mentioned phosphors, pigments, dyes, pseudo-pigments or the like may also be added to the fluorescent layer as a tone converting material.

EXAMPLE

Examples are given below for illustrating the present invention, but are not construed as limiting the invention thereto.

Example 1

As phosphor-forming raw materials, 46.37 g of $WO_3$ powder, 17.60 g of $Eu_2O_3$ powder and 3.69 g of $Li_2CO_3$ powder were weighed and uniformly mixed in a ball mill, giving a raw material mixture.

The raw material mixture was then placed in an alumina crucible where it was fired at a temperature of 900° C. for 6 hours. The fired product was thoroughly washed with pure water to remove the unnecessary soluble components, thereafter finely milled in a ball mill, and sieved (sieve opening 53 μm), yielding a red light emitting phosphor of the composition: $LiEuW_2O_8$.

Figure 10:
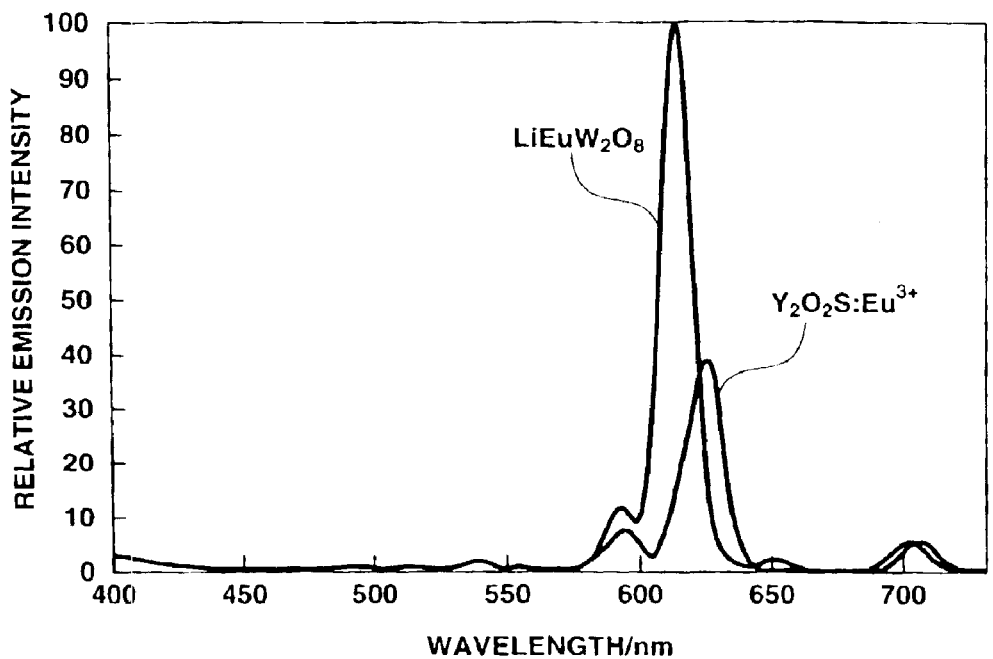
FIG. 10 is a diagram showing the emission spectra of the inventive red light emitting phosphor LiEuW$_2$O$_8$ and Y$_2$O$_2$S:Eu.

For this red light emitting phosphor $LiEuW_2O_8$, the intensity of emission upon excitation at 380 nm was determined by means of a compact spectrofluorometer FP-750 (Nihon Bunko Co., Ltd.) using a conventional $Y_2O_2S$:Eu phosphor as standard. A high value of 2.5 times the standard was recorded as shown in FIG. 10. Since the emission of $LiEuW_2O_8$ has a peak at 614 nm and the emission of $Y_2O_2S$:Eu has a peak at 624 nm, the combined use of these phosphors can increase the emission area of the red region.

Figure 11:
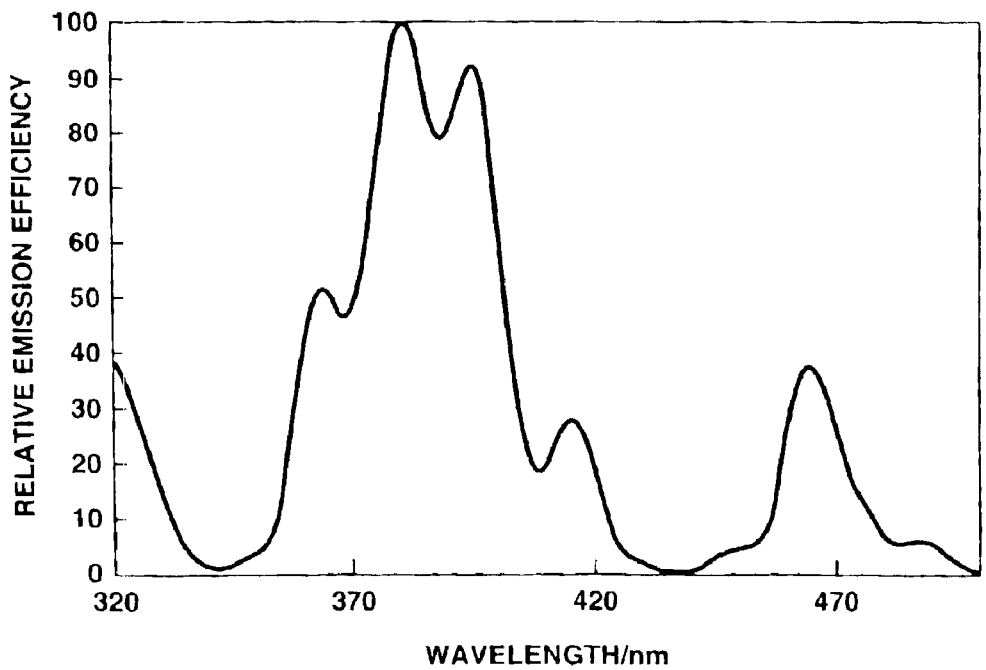
FIG. 11 is a diagram showing the excitation spectrum for the inventive red light emitting phosphor LiEuW$_2$O$_8$.

Since the excitation wavelength of the red light emitting phosphor $LiEuW_2O_8$ is positioned in the range between long-wavelength ultraviolet and short-wavelength visible light (350–420 nm), the light of wavelength within this range can be converted to light of 614 nm. In particular, since maximum absorption peaks attributable to the 4f—4f transition of $Eu^{3+}$ develop at 380 nm and 395 nm as shown in FIG. 11, this phosphor is effective with an excitation light source of emitting light having a wavelength of approximately 380 nm to 420 nm. Such a sharp excitation wavelength proves that these are absorption peaks due to $Eu^{3+}$.

Examples 2–4

$WO_3$ powder, $Eu_2O_3$ powder, $Li_2CO_3$ powder and $Y_2O_3$ powder were weighed in such a stoichiometric ratio that the ratio of metal elements and rare earth elements in the resultant phosphor might be represented by $LiEu_xY_{(1-x)}W_2O_8$ wherein x=0.3, 0.5 or 0.7, and uniformly mixed in a ball mill, giving raw material mixtures.

The raw material mixtures were then placed in an alumina crucible where they were fired at a temperature of 900° C. for 6 hours. The fired products were thoroughly washed with pure water to remove the unnecessary soluble components, thereafter finely milled in a ball mill, and sieved (sieve opening 53 μm), yielding red light emitting phosphors of the composition: $LiEu_xY_{(1-x)}W_2O_8$ wherein x=0.3, 0.5 and 0.7.

For these red light emitting phosphors, the intensity of emission upon excitation at 380 nm was determined by means of the compact spectrofluorometer FP-750 (Nihon Bunko Co., Ltd.) using the conventional $Y_2O_2S$:Eu phosphor as standard. $LiEu_xY_{(1-x)}W_2O_8$ wherein x=0.3 (Example 2) marked a high value of 1.4 times the standard, $LiEu_xY_{(1-x)}W_2O_8$ wherein x=0.5 (Example 3) marked a high value of 1.8 times the standard, and $LiEu_xY_{(1-x)}W_2O_8$ wherein x=0.7 (Example 4) marked a high value of 2.2 times the standard.

Example 5

As phosphor-forming raw materials, 46.37 g of $WO_3$ powder, 17.60 g of $Eu_2O_3$ powder and 3.69 g of $Li_2CO_3$ powder were weighed and uniformly mixed in a ball mill, giving a raw material mixture.

The raw material mixture was then placed in an alumina crucible where it was fired at a temperature of 900° C. for 6 hours. The fired product was thoroughly washed with pure water to remove the unnecessary soluble components, thereafter finely milled in a ball mill, sieved (sieve opening 53 μm), and subjected to aqueous alkali solution-washing treatment by immersing in a 2% sodium hydroxide aqueous solution for 30 minutes. This was followed by water washing, filtration and drying, yielding a red light emitting phosphor of the composition: $LiEuW_2O_8$.

For this red light emitting phosphor $LiEuW_2O_8$, the intensity of emission upon excitation at 380 nm was determined by means of the compact spectrofluorometer FP-750 (Nihon Bunko Co., Ltd.) using the conventional $Y_2O_2S$:Eu phosphor as standard. It exhibited a relative emission intensity as high as 120.1, provided that the emission intensity of the sample not subjected to aqueous alkali solution-washing treatment was 100.

Examples 6–8

By following the procedure of Example 5 except that a lithium hydroxide aqueous solution at pH 11 (Example 6), a sodium hydroxide aqueous solution at pH 11 (Example 7), or a potassium hydroxide aqueous solution at pH 11 (Example 8) was used instead of the 2% sodium hydroxide aqueous solution, red light emitting phosphors of the composition: $LiEuW_2O_8$ were obtained.

For these red light emitting phosphors $LiEuW_2O_8$, the intensity of emission upon excitation at 380 nm was determined by means of the compact spectrofluorometer FP-750 (Nihon Bunko Co., Ltd.) using the conventional $Y_2O_2S$:Eu phosphor as standard. They exhibited a relative emission intensity as high as 101.0 (Example 6), 103.3 (Example 7) and 108.4 (Example 8), provided that the emission intensity of the sample not subjected to aqueous alkali solution-washing treatment was 100.

Example 9

As phosphor-forming raw materials, 46.37 g of $WO_3$ powder, 17.60 g of $Eu_2O_3$ powder and 5.00 g of $CaCO_3$ powder were weighed and uniformly mixed in a ball mill, giving a raw material mixture.

The raw material mixture was then placed in an alumina crucible where it was fired at a temperature of 900° C. for 6 hours. The fired product was thoroughly washed with pure water to remove the unnecessary soluble components, thereafter finely milled in a ball mill, sieved (sieve opening 53 μm), and subjected to aqueous acid solution-washing treatment by immersing in a 2% hydrochloric acid aqueous solution for 30 minutes. This was followed by water washing, filtration and drying, yielding a red light emitting phosphor of the composition: $Ca_{0.5}EuW_2O_8$.

For this red light emitting phosphor $Ca_{0.5}EuW_2O_8$, the intensity of emission upon excitation at 380 nm was determined by means of the compact spectrofluorometer FP-750 (Nihon Bunko Co., Ltd.). It exhibited a relative emission intensity as high as 117.5, provided that the emission intensity of the sample not subjected to aqueous acid solution-washing treatment was 100.

Example 10

A fluorescent layer 7 in which $LiEuW_2O_8$ as a red light emitting phosphor, $Sr(PO_4)_3Cl$:Eu as a blue light emitting phosphor and $BaMg_2Al_{16}O_{27}$:Eu,Mn as a green light emitting phosphor were mixed in a ratio of 10:3:3 and dispersed in silicone rubber was shaped into a silicone rubber cap as shown in FIG. 7 by means of a heat press machine. The cap as the fluorescent layer was fitted over an encapsulant of a ultraviolet LED having an emission wavelength of 380 nm to construct a light emitting device as shown in FIG. 7.

Figure 12:
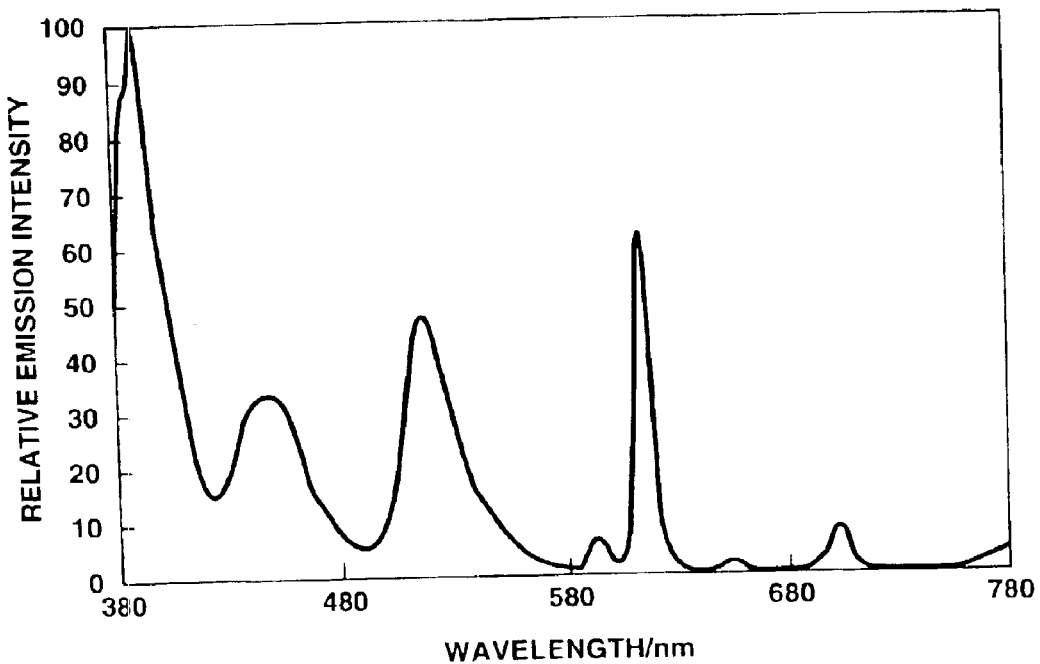
FIG. 12 is a diagram showing the distribution of light emitted by the light emitting device of Example 9.

In an integrating sphere, a current flow of 20 mA was conducted across the light emitting device for operation, and the spectral distribution of the light radiated was determined by a spectroradiometer PR-704 (Photo Research Co.). The spectral distribution is shown in FIG. 12. This light emitting device emitted white light at a high luminance which was 2.3 times the luminance achieved using $Y_2O_2S$:Eu as the red light emitting phosphor.

Example 11

A fluorescent layer 7 in which $LiEuW_2O_8$ and $Y_2O_2S$:Eu as red light emitting phosphors, $Sr_5(PO_4)_3Cl$:Eu as a blue light emitting phosphor and $BaMg_2Al_{16}O_{27}$:Eu,Mn as a green light emitting phosphor were mixed in a ratio of 15:15:3:3 and dispersed in silicone rubber was shaped into a silicone rubber cap as shown in FIG. 7 by means of a heat press machine. The cap as the fluorescent layer was fitted over an encapsulant of a ultraviolet LED having an emission wavelength of 380 nm to construct a light emitting device as shown in FIG. 7.

Figure 13:
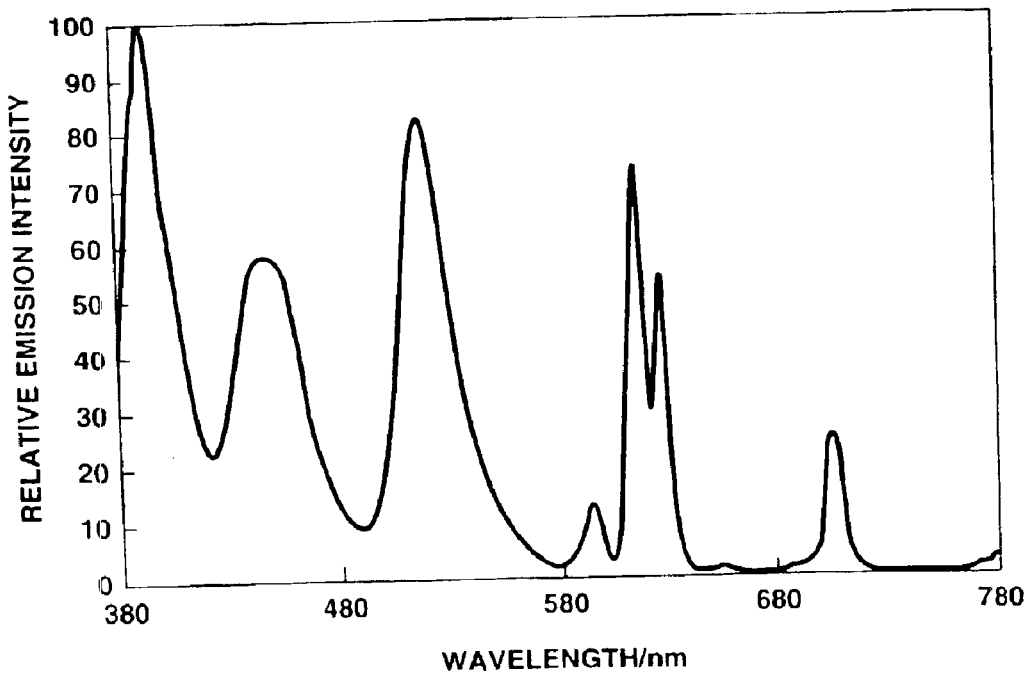
FIG. 13 is a diagram showing the distribution of light emitted by the light emitting device of Example 10.

In an integrating sphere, a current flow of 20 mA was conducted across the light emitting device for operation, and the spectral distribution of the light radiated was determined by the spectroradiometer PR-704 (Photo Research Co.). The spectral distribution is shown in FIG. 13. This light emitting device emitted white light at a high luminance which was 1.6 times the luminance achieved using $Y_2O_2S$:Eu alone as the red light emitting phosphor.

As is evident from the foregoing, the red light emitting phosphor of the invention emits red light at a high efficiency and a high luminance in response to excitation light having a wavelength of 350 to 420 nm, is effective for drastically improving the emission luminance in the red region of a light emitting device comprising the red light emitting phosphor, and thus produces red emission at a consistent intensity in response to a wide wavelength range of from long-wavelength ultraviolet radiation to short-wavelength visible light.

Since the inventive red light emitting phosphor is little affected by variations in wavelength of the exciting light, it enables to display a subtle color tone in a more precise and reproducible manner when it is combined with green and blue light emitting phosphors so that the phosphors produce emissions in response to light from a semiconductor light emitter capable of emitting light of the above-described wavelength, for providing a display of white or intermediate color.

What is claimed is:

1. A red light emitting phosphor capable of emitting red light upon excitation with light having a wavelength of 350 to 420 nm, characterized by having a composition of compositional formula (1):

$$AEu_xLn_{(1-x)}M_2O_8 \qquad (1)$$

wherein A is at least one element selected from the group consisting of Li, Na, K, Rb and Cs, and is partially substituted with at least one element selected from the group consisting of Mg, Ca, Sr and Ba to be added as a co-activator, Ln is at least one element selected from the group consisting of Y and rare earth elements exclusive of Eu, M is at least one element selected from the group consisting of W and Mo, and x is a positive number satisfying $0<x\leq 1$.

2. A red light emitting phosphor capable of emitting red light upon excitation with light having a wavelength of 350 to 420 nm, characterized by having a composition of compositional formula (2):

$$D_{0.5}Eu_yLn_{(1-y)}M_2O_8 \qquad (2)$$

wherein D is at least one element selected from the group consisting of Mg, Ca, Sr and Ba, Ln is at least one element selected from the group consisting of Y and rare earth elements exclusive of Eu, M is at least one element selected from the group consisting of W and Mo, and y is a positive number satisfying $0<y\leq 1$.

3. The red light emitting phosphor of claim 1 or 2, characterized in that Ln in the formula is at least one element selected from the group consisting of Y, La, Gd and Lu.

4. The red light emitting phosphor of claim 1 or 2, characterized in that Eu constituting the red light emitting phosphor is in the form of trivalent europium ions ($Eu^{3+}$) which are arranged in a two- or one-dimensional array.

5. A method for preparing the red light emitting phosphor of claim 1, characterized by comprising the steps of mixing raw materials containing elements constituting the red light emitting phosphor, firing the resulting mixture, and washing the fired product with an aqueous alkali solution.

6. A method for preparing the red light emitting phosphor of claim 2, characterized by comprising the steps of mixing raw materials containing elements constituting the red light emitting phosphor, firing the resulting mixture, and washing the fired product with an aqueous acid solution.

7. A light emitting device comprising a semiconductor light emitter capable of emitting light having a wavelength of 350 to 420 nm, enclosed in an encapsulant, characterized in that the red light emitting phosphor of claim 1 or 2 is dispersed in the encapsulant.

8. A light emitting device comprising a semiconductor light emitter capable of emitting light having a wavelength of 350 to 420 nm, enclosed in an encapsulant, characterized in that a fluorescent layer containing the red light emitting phosphor of claim 1 or 2 is disposed in an optical path of the light from the semiconductor light emitter.

9. A light emitting device comprising a semiconductor light emitter capable of emitting light having a wavelength of 350 to 420 nm, enclosed in an encapsulant, characterized in that a fluorescent layer containing the red light emitting phosphor of claim 1 or 2 is disposed on the semiconductor light emitter or the encapsulant.

10. A light emitting device comprising a semiconductor light emitter capable of emitting light having a wavelength of 350 to 420 nm, enclosed in an encapsulant, characterized in that a fluorescent layer comprising the red light emitting phosphor of claim 1 or 2 dispersed in a resin, rubber, elastomer or glass is disposed on the semiconductor light emitter or the encapsulant.

11. The red light emitting phosphor as claimed in claim 1 wherein x is a positive number satisfying $0.3 \leq x \leq 1$.

12. The red light emitting phosphor as claimed in claim 1 wherein x is a positive number satisfying $0.5 \leq x \leq 1$.

13. The red light emitting phosphor as claimed in claim 2 wherein y is a positive number satisfying $0.3 \leq y \leq 1$.

14. The red light emitting phosphor as claimed in claim 2 wherein y is a positive number satisfying $0.5 \leq y \leq 1$.

* * * * *